(12) United States Patent
Sun et al.

(10) Patent No.: US 9,231,713 B2
(45) Date of Patent: Jan. 5, 2016

(54) METHOD FOR DESIGNING AN ANALOG NYQUIST FILTER

(71) Applicant: Titan Photonics, Inc., Fremont, CA (US)

(72) Inventors: Chen-Kuo Sun, Escondido, CA (US); Paul N. Huntley, Poway, CA (US)

(73) Assignee: Charlie Chen, Santa Clara, CA (US)

( * ) Notice: Subject to any disclaimer, the term of this patent is extended or adjusted under 35 U.S.C. 154(b) by 0 days.

(21) Appl. No.: 14/270,663

(22) Filed: May 6, 2014

(65) Prior Publication Data

US 2015/0256273 A1    Sep. 10, 2015

Related U.S. Application Data

(63) Continuation-in-part of application No. 14/200,592, filed on Mar. 7, 2014.

(51) Int. Cl.
*H04B 17/13* (2015.01)
*G06F 17/50* (2006.01)
*H04L 25/03* (2006.01)
*H04B 17/19* (2015.01)

(52) U.S. Cl.
CPC ............... *H04B 17/13* (2015.01); *G06F 17/50* (2013.01); *H04B 17/19* (2015.01); *H04L 25/03057* (2013.01); *H04L 25/03159* (2013.01); *H04L 2025/03484* (2013.01)

(58) Field of Classification Search
CPC .. H04B 17/13; H04B 17/19; H04L 25/03057; H04L 25/03159; G06F 17/50
See application file for complete search history.

(56) References Cited

U.S. PATENT DOCUMENTS

| | | | | | |
|---|---|---|---|---|---|
| 4,759,039 | A | * | 7/1988 | Debus et al. | 375/298 |
| 6,094,667 | A | * | 7/2000 | Zhou et al. | 708/321 |
| 6,148,037 | A | * | 11/2000 | Abe | 375/321 |
| 6,563,897 | B1 | * | 5/2003 | Kitta | 375/375 |
| 7,345,604 | B2 | | 3/2008 | Watson | |
| 2004/0165303 | A1 | * | 8/2004 | Wu et al. | 360/65 |
| 2004/0185812 | A1 | * | 9/2004 | Suzuki et al. | 455/131 |

\* cited by examiner

*Primary Examiner* — Leon Flores
(74) *Attorney, Agent, or Firm* — Nydegger & Associates

(57) ABSTRACT

Methodologies for designing and assembling an analog Nyquist filter require a filter unit which includes a low pass filter in cascade with at least one tapped delay filter. A Signal Generator is used to generate a test pattern for input into the filter unit in order to create a reaction signal from the filter unit. This reaction signal is then compared with a desired Nyquist response. Based on this comparison, amplifier gains for taps in the tapped delay filter are weighted to establish a transfer function in the filter unit. In operation the transfer function shapes analog input signals with the desired Nyquist response for use as an output from the Nyquist filter.

19 Claims, 4 Drawing Sheets

METHOD FOR DESIGNING AN ANALOG NYQUIST FILTER

This application is a continuation-in-part of application Ser. No. 14/200,592 filed Mar. 7, 2014, which is currently pending. The contents of application Ser. No. 14/200,592 are incorporated herein by reference.

FIELD OF THE INVENTION

The present invention pertains generally to analog filters which can be used to filter analog or digital signals having a predetermined symbol rate. More particularly, the present invention pertains to Nyquist filters which are designed and assembled to filter signals using only hardware components. The present invention is particularly, but not exclusively, useful for designing filters having a Nyquist response, wherein samples are taken from an analog input signal by a tapped delay filter (equalizer) and are weighted to create the filter, based on a comparison between the filter's response to a known test pattern and a desired Nyquist response.

BACKGROUND OF THE INVENTION

All telecommunication systems have the objectives of transmitting signals with minimal signal loss, and with the highest possible signal to noise ratio (SNR). Also, in order to simplify the transmitting system's architecture and reduce its power requirements, it is desirable that signal transmissions be successfully accomplished with limited bandwidth requirements. To further these purposes, filters are often used in transmission systems to reduce bandwidth requirements and to minimize unwanted noise (interference) during a signal transmission.

In the context of the present invention, it is to be understood that many data signals are digitally generated as a stream of bits. Accordingly, digital signal processing techniques are typically considered. It is known, however, that digital processing techniques are generally impractical at high data rates.

With a view toward processing digital data signals at high data rates, it is to be appreciated that these signals can be characterized as a sequence of symbols which are akin to a frequency. In this characterization, each symbol includes an integer number of bits, and each symbol in the sequence has a same duration time, T. A transmitting device can then put symbols onto a channel at a symbol rate, Rs, with T=1/Rs. An important consequence of this is that by using techniques well known in the pertinent art, digital signals can be effectively processed as analog signals.

As implied above, many telecommunications systems incorporate low pass filters for the purpose of limiting a system's bandwidth requirements. As the name implies, low pass filters are designed to pass signals having frequencies which are below a predetermined stop bandwidth frequency. Because the signals are sinusoidal in nature, it happens that the signal level will begin to noticeably diminish at the higher frequencies in a bandwidth which are near, but below, the stop bandwidth frequency.

It is, of course, desirable to effectively use all frequencies in a bandwidth. To do this, a particular type of filter which comes closest to maximizing the useful bandwidth response is a low pass filter which is commonly referred to as a "Nyquist filter." Ideally, a Nyquist filter will reduce the required bandwidth for transmitting a data signal, and it will do so without degrading the signal.

With the above in mind, it is an object of the present invention to present methodologies which employ empirical, analog signal processing techniques for designing and assembling tapped delay filters that provide a Nyquist filter response in a telecommunications system. In another aspect, it is an object of the present invention to provide methodologies using analog techniques for equalizing a simple low pass filter to manufacture an analog Nyquist filter having sophisticated performance characteristics. Another object of the present invention is to provide methodologies for use in the manufacture of analog Nyquist filters that rely solely on altering the hardware characteristics of filter components. It is also an object of the present invention to design a Nyquist filter that is capable of processing digital signals at high data rates. Still another object of the present invention is to provide methods for designing and assembling analog Nyquist filters which are easy to implement, are simple to modify in order to accommodate specific implementations, and are cost effective.

SUMMARY OF THE INVENTION

In overview, the present invention is directed to methods and systems for designing and assembling an analog Nyquist filter that will provide a low pass filter function. In particular, the methodologies of the present invention involve empirically setting the amplifier gains (i.e. tap weights) for a tapped delay filter, and to thereby configure a filter unit which will elicit an operational analog Nyquist response with a low pass filter function during the transmission of a data signal. The desired output spectrum, $Hrc(\alpha,f)$, for this analog Nyquist response is a raised cosine function, wherein $\alpha$ is a bandwidth factor and f is frequency. Operationally, the present invention configures the filter unit by creating a transfer function, $RC(\alpha,f)$, for the filter unit, which can be mathematically characterized as a sin c corrected, raised cosine function. More specifically, this sin c corrected, raised cosine filter function, $RC(\alpha,f)$, results by correcting the analog Nyquist response $Hrc(\alpha,f)$, i.e. the filter unit output, with a sin c function, $\sin c(\pi f/Rs)$. Thus, as a mathematical expression:

$$RC(\alpha,f) = \sin c(\pi f/Rs)^{-1} Hrc(\alpha,f).$$

For the present invention, when using a Pseudo-Random Bit Stream (PRBS) as an input, the reaction signal of the filter unit will have a beginning roll-off frequency, $F_{R1}$, and an ending roll-off frequency, $F_{R2}$. Mathematically expressed:

$$F_{R1} = (1-\alpha)Rs/2; \text{ and}$$

$$F_{R2} = (1+\alpha)Rs/2.$$

In the above expressions, Rs is the symbol rate of the data signal being filtered, and $\alpha$ is a bandwidth factor which depends on the number of taps, N, that are used for the tapped delay filter. For example, $\alpha=0.25$ will typically correspond with a tapped delay filter having seven taps, N=7. Further, $F_{R2}$ is preferably established such that, $F_{R2}=(1+\alpha)Rs/2=0.625Rs$.

With the above in mind, a method for designing a Nyquist filter with a low pass filter function in accordance with the present invention requires initially providing a filter unit. Structurally, the filter unit includes a low pass analog filter which is connected in cascade with at least one, or two tapped delay filters. As is well known in the pertinent art, each tap of the tapped delay filter will have a dedicated amplifier. For the present invention, the tapped delay filter may be a Finite Impulse Response (FIR) filter, or an Infinite Impulse Response (IIR) filter, or it may be a Feed Forward Equalizer (FFE) filter. Insofar as the low pass analog filter is concerned, for testing and design purposes, the present invention envisions the use of any type filter well known in the pertinent art, such as a lossy transmission line, an LC filter, or a linear phase low pass filter. Preferably, in order to reduce the required number of taps for testing and design, the filter that is used will have a 3 dB bandwidth that is typically 0.7Rs.

Using the filter unit, the next step in the methodology of the present invention is to generate a test pattern for use as an input into the filter unit. Specifically, for this purpose the test pattern can be an analog signal having a predetermined symbol rate (Rs), such as a Pseudo-Random Bit Stream (PRBS). Alternatively, another test pattern type that can be used is an impulse function. In this latter case, an impulse function can be approximated by a narrow pulse, as long as the pulse width is less than the tap delay, $\tau$. In each case, the test pattern is used to create a reaction signal which is then compared with the desired Nyquist response. In this comparison, the reaction signal can be evaluated using an eye diagram (pattern) in a manner well known in the art.

Based on the comparison between the reaction signal and the desired Nyquist response, tap weights for the taps of the tapped delay filter are determined. For the case where an impulse function (waveform) is used for design purposes, there is the added advantage that the reaction signal sequentially reads out the tap weights in the time domain. This allows a simple method for individually adjusting the tap weights so that the reaction signal matches the impulse response of the desired sin c-corrected raised cosine filter function $RC(\alpha,f)$. In any event, it is with the tap weights that a gain is identified for each dedicated amplifier in the tapped delay filter. Consequently, the gain for each tap of the tapped delay filter is based on the comparison between the desired Nyquist response and the reaction signal, and this comparison is used to alter the tapped delay filter to establish a transfer function, $RC(\alpha,f)$, for the filter unit.

In some cases the transfer function for the analog low pass filter, $CH(f)$, of the filter unit, in the frequency domain, is well defined or can be measured. $Eq(f)$ is an equalizer function in the frequency domain for the tapped delay filter of the Nyquist filter which can then be expressed as the ratio of the transfer function $RC(\alpha,f)$ of the filter unit to the transfer function of the analog low pass filter, $CH(f)$ in the filter unit:

$$Eq(f)=RC(\alpha,f)/CH(f).$$

It will also be appreciated that in the time domain a corresponding impulse response, eq, can then be expressed for the tapped delay filter as the Inverse Fast Fourier Transform (IFFT) of the equalizer function $Eq(f)$ from the frequency domain:

$$eq=IFFT(Eq(f)).$$

It is this impulse response, eq, that is then sampled an n number of times for each symbol in order to establish amplifier gains as weight taps in the tapped delay filter.

In sum, the gain for each tap of the tapped delay filter is adjusted so that the product of the transfer function of the tapped delay filter, $Eq(f)$, and the transfer function of the low pass filter response, $CH(f)$, equals the sin c-corrected raised cosine transfer function, $RC(\alpha,f)$ of the filter unit:

$$RC(\alpha,f)=Eq(f)CH(f).$$

The resultant filter unit can then be used as a Nyquist filter.

For a preferred embodiment of the present invention, which will give the best signal to noise ratio, albeit at the expense of more hardware, the filter unit includes a first tapped delay filter and a second tapped delay filter. In combination, the first tapped delay filter is connected to an input of the low pass filter and the second tapped delay filter is connected to an output of the low pass filter. Further, the second tapped delay filter is matched to the first tapped delay filter. For this particular combination, each filter has a transfer function that is equal to the square root of $Eq(\alpha,f)$. Consequently, the cascaded function of all three filters will equal $RC(\alpha,f)$, for the sin c-corrected raised cosine filter. In one alternate embodiment of the present invention, a single tapped delay filter is connected to an input of the low pass filter. In another alternate embodiment of the present invention, a single tapped delay filter is connected to an output of the low pass filter.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
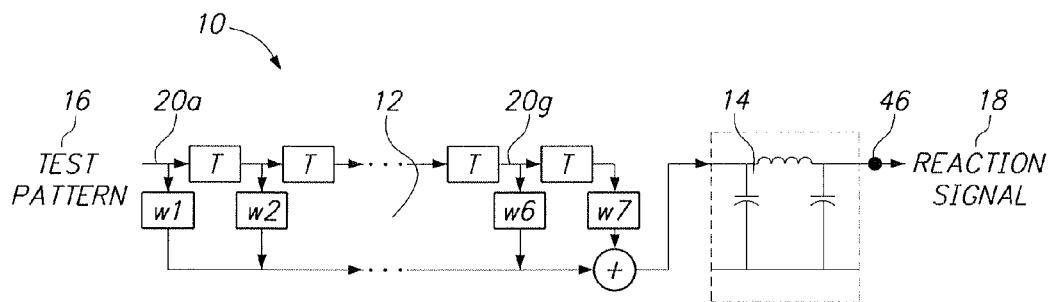
FIG. 1 is a schematic presentation of components in a filter unit that is to be designed and assembled as a Nyquist filter in accordance with the present invention.

Referring initially to FIG. 1, a filter unit in accordance with the present invention is shown and is generally designated 10.

As shown, the exemplary filter unit 10 includes a tapped delay filter 12 and an analog low pass filter 14 which are connected in cascade with each other. In this combination, the tapped delay filter 12 may be of any type that is well known in the pertinent art, such as a Finite Impulse Response (FIR) filter, an Infinite Impulse Response (IIR) filter, or a Feed Forward Equalizer (FFE) filter. Insofar as the analog low pass filter 14 is concerned, it may also be of any type filter well known in the pertinent art, such as a lossy transmission line, an LC filter, or a linear phase low pass filter.

As appreciated by the present invention, the filter unit 10 inherently creates a transfer function $RC(\alpha,f)$ that will shape an input, e.g. a test pattern (data signal) 16, into a reaction signal (useable output) 18. The present invention, however, is used to specifically shape the transfer function $RC(\alpha,f)$ to produce a desired or predetermined output signal 18. Specifically, in accordance with the present invention, this is done by properly configuring the tapped delay filter 12.

Figure 2:
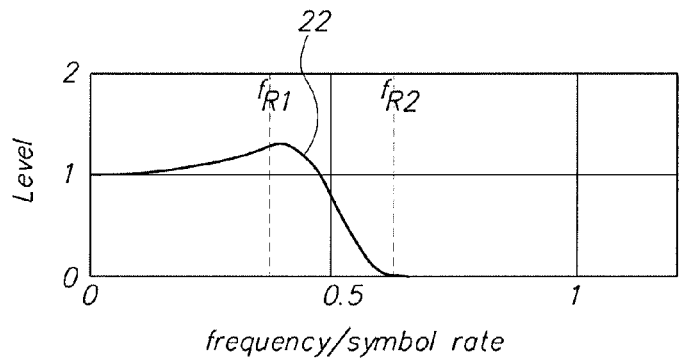
FIG. 2 shows a frequency response of a "Sin c Corrected Raised Cosine Filter" which is used as a desired Nyquist Response for the present invention.

For discussion purposes, a typical input filter unit 10 may include a tapped delay filter 12 having an N number of taps. Operationally, an n number of these N taps will be used to sequentially sample each symbol in the data signal 16. As envisioned for the present invention, the number n is a real number that will preferably be less than about 2 (e.g. n=1.7). In any case, n must be greater than 1 (n>1). For disclosure purposes, and as shown in FIG. 1, N=7 for taps 20a-20g. Between all adjacent taps 20 there will be a same duration time, $\tau$, where $\tau=(nRs)^{-1}$, and each tap 20 will have a dedicated amplifier (e.g. w1 ... w7). As intended for the present invention, a preferred transfer function $RC(\alpha,f)$ for the filter unit 10 will have a frequency response 22 substantially as shown in FIG. 2. To achieve this response 22, however, requires a correction of the filter unit 10.

In order to design the transfer function $RC(\alpha,f)$ for the filter unit 10, it is to be appreciated that, with a PRBS input to the filter unit 10, the output spectrum of the reaction signal 18 in the frequency domain will be a raised cosine function, Hrc $(\alpha,f)$.

Figure 3:
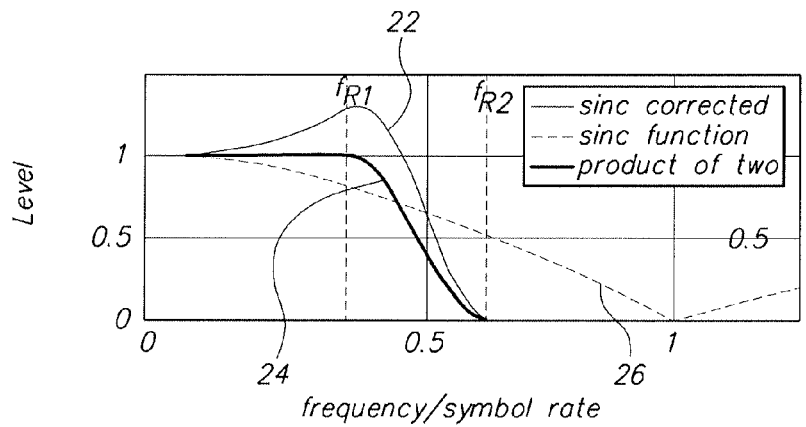
FIG. 3 shows a desired frequency spectrum of the output reaction signal of a Nyquist filter of the present invention, with the output shown superposed on pertinent frequency functions used for the design of the output.

Mathematically, the various transfer functions involved with the present invention, and their relationships with each other, are set forth below. For each of these mathematical expressions, $\alpha$ is a bandwidth factor, Rs is a symbol frequency, and f is frequency. In FIG. 3, it will be appreciated that each transfer function can be considered across three frequency regions. In this case, the regions are defined relative to a beginning roll-off frequency, $F_{R1}$, and an ending roll-off frequency, $F_{R2}$ which, as indicated above, are respectively expressed as:

$$F_{R1}=(1-\alpha)Rs/2; \text{ and}$$

$$F_{R2}=(1+\alpha)Rs/2.$$

More specifically, a first region can be defined for frequencies f below $F_{R1}$, a second region can be defined for frequencies f between $F_{R1}$ and $F_{R2}$, and a third region can be defined for frequencies f greater than $F_{R2}$. In detail, these regions are respectively defined, in order, as:

$$f < (1-\alpha) \cdot \frac{Rs}{2} \qquad Hrc(\alpha, f) = 1$$

$$(1-\alpha) \cdot \frac{Rs}{2} \leq f \leq (1+\alpha) \cdot \frac{Rs}{2} \quad Hrc(\alpha, f) = \frac{1}{2} \cdot \left[1 + \cos\left[\frac{\pi}{\alpha} \cdot \left(\frac{f}{Rs} - \frac{1-\alpha}{2}\right)\right]\right]$$

$$f > (1+\alpha) \cdot \frac{Rs}{2} \qquad Hrc(\alpha, f) = 0$$

Of particular importance here are the values for the output spectrum of the reaction signal $Hrc(\alpha,f)$ for each of the regions. The result here is plot 24 of the reaction signal shown in FIG. 3.

Still referring to FIG. 3, the input spectrum 26, transfer function 22 and the plot of desired output reaction signal 24 can be expressed as:

Input Spectrum (the sin c Function 26)

$$\mathrm{sinc}\left(\pi \cdot \frac{f}{Rs}\right) = \frac{\sin\left(\pi \cdot \frac{f}{Rs}\right)}{\left(\pi \cdot \frac{f}{Rs}\right)}$$

Filter Unit Transfer Function (Frequency Response 22)

$$RC(\alpha, f) = \frac{Hrc(\alpha, fn)}{\mathrm{sinc}\left(\pi \frac{f}{Rs}\right)}$$

Output Spectrum (Reaction Signal 24)

$$Hrc(\alpha, f) = \mathrm{sinc}\left(\pi \cdot \frac{f}{Rs}\right) RC(\alpha, f)$$

It is to be appreciated that for purposes of the present invention, the frequency responses shown in FIG. 3 are exemplary of a test filter unit 10. For this example, $\alpha=0.25$, which will typically correspond with a tapped delay filter having seven taps, N=7, and n=2, so that $\tau=(nRs)^{-1}=(2Rs)^{-1}$. Also, $F_{R2}=(1+\alpha)Rs/2=0.625Rs$.

Figure 4A:
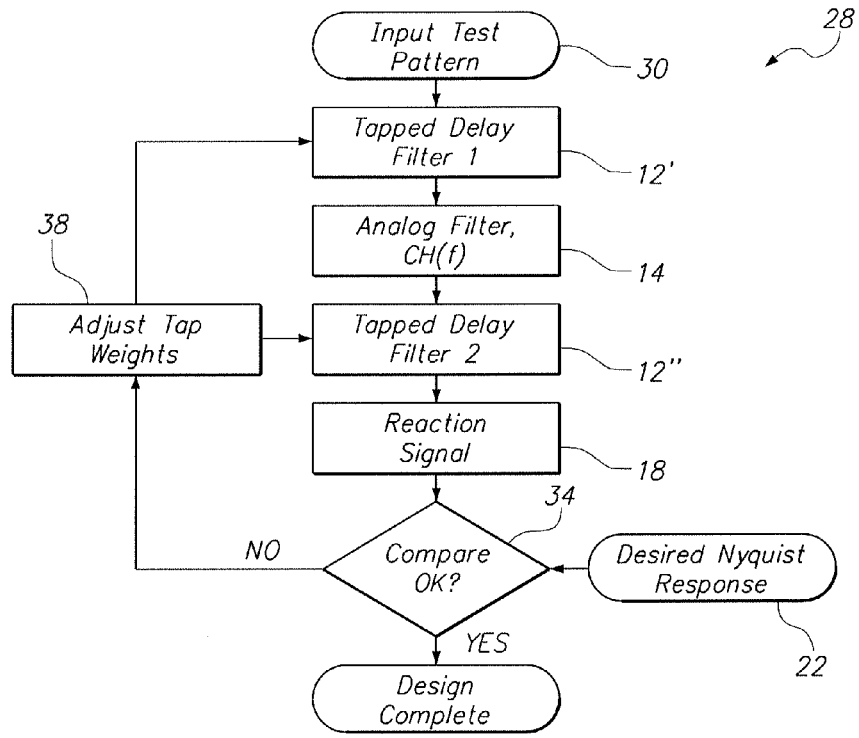
FIG. 4A is an operational flow chart showing the interactive tasks that are necessary for modifying the transfer functions shown in FIG. 4B during the design and assembly of an analog Nyquist filter in accordance with the methodologies of the present invention.
Figure 4B:
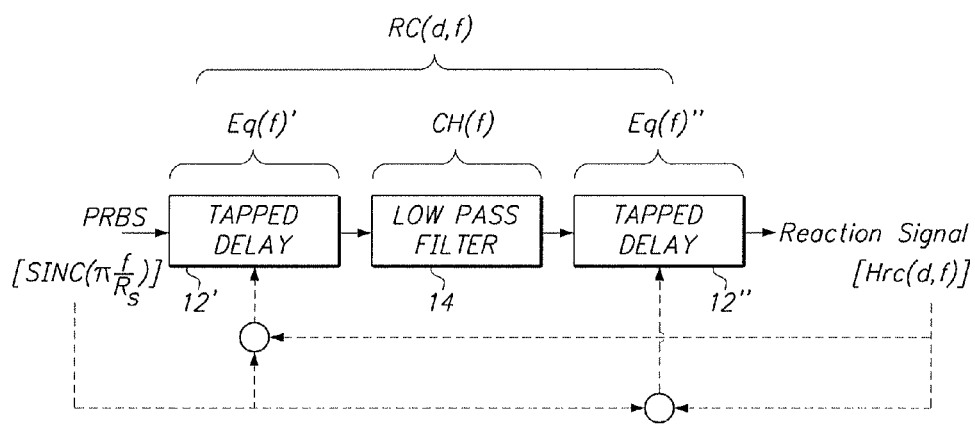
FIG. 4B is a schematic presentation of a transfer function interaction between inter-operative components of the present invention during the design and assembly of an analog Nyquist filter in accordance with the present invention.
Figure 5:
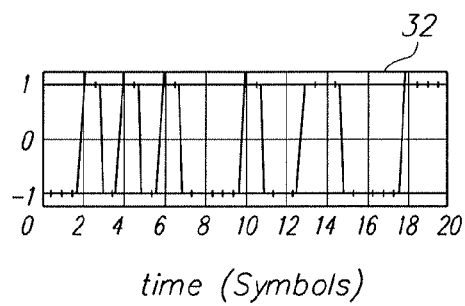
FIG. 5 is an exemplary Non-Return to Zero (NRZ) bit stream (time domain) to be used by the present invention as a test pattern (for design and assembly purposes), or as an input (for operational purposes)

An operation of the present invention is perhaps best appreciated by cross referencing FIG. 4A with FIG. 4B. For the design and testing of the filter unit 10 in accordance with the present invention, a user of the invention will normally follow the task functions indicated by an exemplary method diagram which is generally designated 28 in FIG. 4A. According to the diagram 28, block 30 indicates that a test pattern 16 needs to be inputted into the filter unit 10. For this purpose, the test pattern 16 will typically be a bit stream 32 similar to the one shown in FIG. 5. Further, FIG. 4B indicates the spectrum of the input test pattern 16 will be a sin c function 26. In general, the test pattern (data signal) 16 can be any PRBS input, such as a Non-Return-to-Zero (NRZ) signal, a Pulse-Amplitude-Modulation (PAM) signal, a Duo-Binary (DB) signal, or a signal from a symbol generator. Importantly, in each instance, the input signal will have a fixed (predetermined) symbol rate, Rs, which is typically greater than one gigabaud.

FIG. 4A indicates that the test pattern 16 is passed through the filter unit 10, where it is influenced by the transfer function, $RC(\alpha,f)$ for output from the filter unit 10 as the reaction signal 18 having a spectrum $Hrc(\alpha,f)$ (see FIG. 4B). Inquiry block 34 of the diagram 28 further indicates that the desired Nyquist frequency response 22 is provided for comparison with the transfer function $RC(\alpha,f)$ of the filter unit 10. In the event there is an inaccurate, incomplete or otherwise disparate comparison between $RC(\alpha,f)$ and the desired Nyquist response 22, $Hrc(\alpha,f)$, inquiry block 34 indicates that the next operational action is for an adjustment of the taps 20 on the tapped delay filter 12 (see block 38). In effect, these adjustments change the transfer function $RC(\alpha,f)$.

Figure 6:
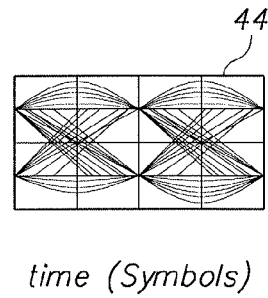
FIG. 6 is an exemplary eye diagram (pattern), of a filter output for use in evaluating the operational design and assembly of the present invention.
Figure 6A:
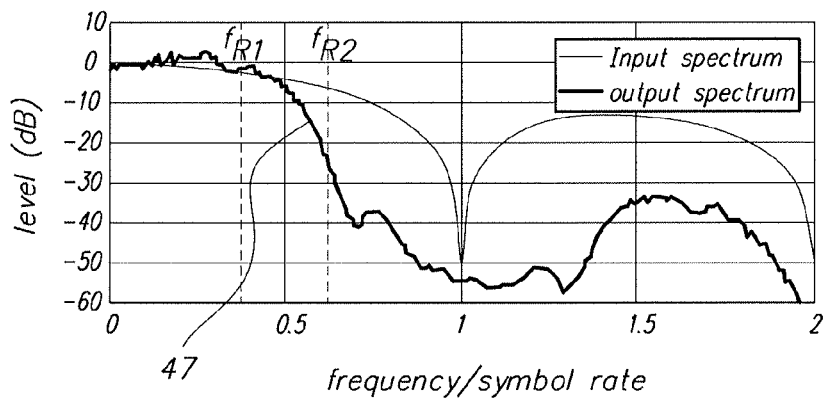
FIG. 6A shows exemplary input and output spectra for a filter unit with a Pseudo-Random Bit Stream (PRBS) input, showing bandwidth reduction using a 3-pole analog low pass filter, having a 3-dB bandwidth of 66% of the symbol rate Rs.

As a practical matter, the comparison required by inquiry block 34 can be accomplished using an oscilloscope (not shown) to produce an eye diagram 44 (see FIG. 6) of a type well known in the pertinent art. In particular, the eye diagram 44 should be taken at a point 46 which is located off the output of filter unit 10 (see FIG. 1). Using the eye diagram 44, the user can then adjust the amplifier gains (tap weights) of the taps 20 on tapped delay filter 12. The intended result will then be an output similar to the output spectrum 47 shown in FIG. 6A.

Figure 7:
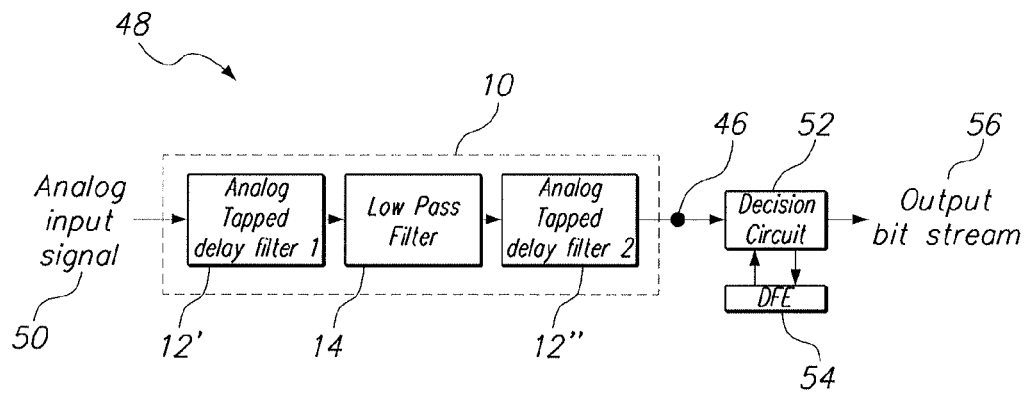
FIG. 7 is a generalized Nyquist filter in accordance with the present invention shown connected with peripheral components for operational use.

In accordance with the above, the purpose of the present invention is to design and assemble a filter unit 10 for use in a data transmission system, such as the one shown in FIG. 7 and generally designated 48. For the exemplary case shown in FIG. 7, the filter unit 10 is shown receiving an analog input signal 50. In this case, the filter unit 10 includes a tapped delay filter 12', which is connected upstream from the low pass filter 14, and it also includes a tapped delay filter 12", which is connected downstream from the low pass filter 14. FIG. 7 also shows that the present invention envisions employing a decision circuit 52, and possibly a Decision Feedback Equalization (DFE) circuit 54 for enhancing the performance of the decision circuit 52 that converts the filtered analog signal 50 into an output bit stream 56. Further, FIG. 7 indicates that the system 48 can be monitored and periodically evaluated with an eye diagram 44 taken at the point 46.

Figure 8A:
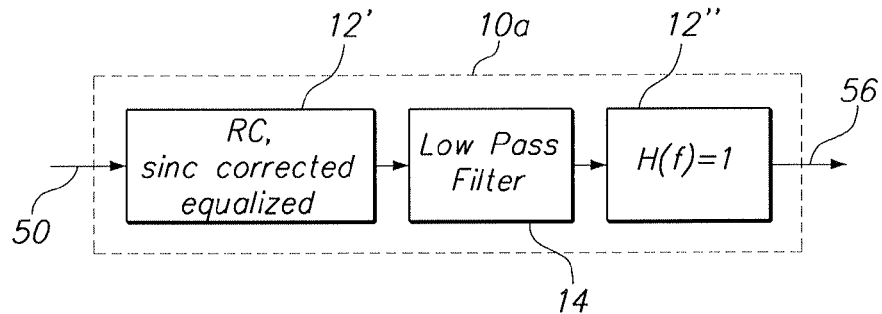
FIG. 8A shows an embodiment of a Nyquist filter designed by the present invention which has no equalizer downstream from the low pass filter.
Figure 8B:
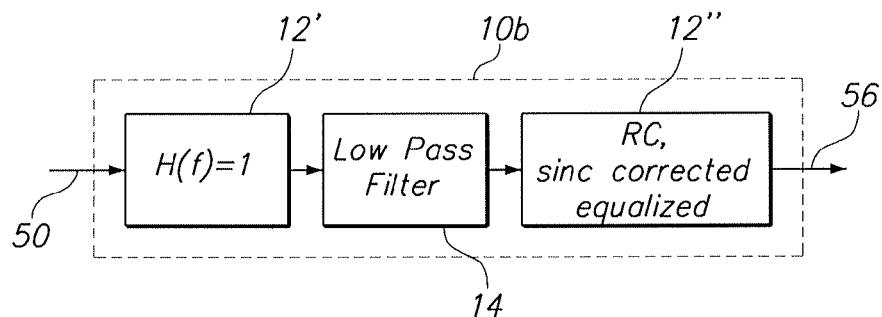
FIG. 8B shows an embodiment of a Nyquist filter designed by the present invention which has no equalizer upstream from the low pass filter.
Figure 8C:
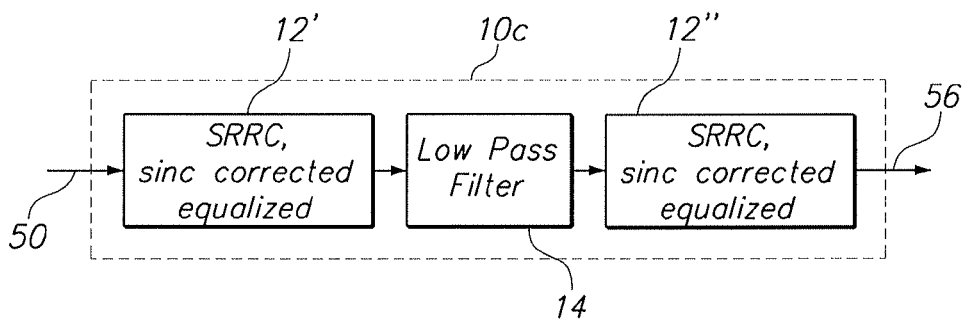
FIG. 8C shows an embodiment of a Nyquist filter designed by the present invention which has equalizers both upstream and downstream from the low pass filter.

Alternate embodiments for the system 48 can selectively include filter units 10a, 10b or 10c, which are respectively shown in FIGS. 8A-C. Specifically, in FIG. 8A the filter unit 10a is shown to have a tapped delay filter 12' which has been designed, as disclosed above, with a transfer function $Eq(\alpha,f)$. Accordingly, the tapped delay filter 12" for the alternate embodiment shown in FIG. 8A has a transfer function $H(f)=1$ (i.e. there essentially is no tapped delay filter 12"). On the other hand, in FIG. 8B, it is the tapped delay filter 12' that has a transfer function $H(f)=1$, with the tapped filter 12" being designed as disclosed above with the transfer function $Eq(\alpha,f)$. In FIG. 8C, however, both of the tapped delay filters 12' and 12" are functional, and they are both designed as square root functions, i.e. the square root of $Eq(\alpha,f)$, which are to be used, in cascade, in a manner well known in the pertinent art to establish the transfer functions $Eq(\alpha,f)$, and $RC(\alpha,f)$ for the filter unit 10.

While the particular Method for Designing an Analog Nyquist Filter as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for designing a Nyquist filter which comprises the steps of:
generating a test pattern, wherein the test pattern is an analog signal having a predetermined symbol rate (Rs);
providing a filter unit, wherein the filter unit includes a low pass filter and a tapped delay filter, wherein the tapped delay filter has an N number of taps, wherein N is an integer greater than zero, and wherein each tap individually samples the test pattern in compliance with the predetermined symbol rate, and wherein each tap has a dedicated amplifier;
inputting the test pattern into the filter unit to create a reaction signal therefrom;
sampling the test pattern an n number of times during each symbol cycle, wherein n is a real number greater than one (n>1), and N is greater than n (N>n);
evaluating the reaction signal in comparison with a desired Nyquist response; and
varying a gain for each dedicated amplifier in the tapped delay filter to weight samples taken by the respective tap, wherein the gain for each tap is based on the comparison made in the evaluating step and is used to alter the tapped delay filter to establish a transfer function, $RC(\alpha,f)$, in the filter unit, wherein $\alpha$ is a bandwidth factor and f is a frequency, for transforming the test pattern into a reaction signal corresponding to a desired, sin c-corrected Nyquist output response, for subsequent use of the filter unit as the Nyquist filter.

2. The method as recited in claim 1 wherein the evaluating step further comprises the steps of:
selecting a raised cosine filter function, $Hrc(\alpha,f)$, to approximate a desired Nyquist function; and
correcting the $Hrc(\alpha,f)$ with a sin c function, $\sin c(\pi f/Rs)$, to establish a sin c corrected raised cosine function, $RC(\alpha,f)$.

3. The method as recited in claim 2 wherein the desired Nyquist function is a reaction signal having a beginning roll-off frequency, $F_{R1}=(1-\alpha)Rs/2$, and an ending roll-off frequency, $F_{R2}=(1+\alpha)Rs/2$, with a bandwidth factor $\alpha=0.25$ functionally corresponding to $N=7$.

4. The method as recited in claim 2 wherein the tapped delay filter has an equalizer function $Eq(f)$, and the low pass filter has a transfer function $CH(f)$, with $Eq(f)$ equal to $RC(\alpha,f)/CH(f)$ for the Nyquist filter in the frequency domain.

5. The method as recited in claim 4 wherein $Eq(f)$ has an impulse response, eq, in the time domain equal to an Inverse Fast Fourier Transform (IFFT) of the equalizer function, $Eq(f)$, $eq=IFFT(Eq(f))$, and wherein the impulse response, eq, is used empirically to establish amplifier gains in the varying step to weight the samples by sampling eq at an n number of samples per symbol.

6. The method as recited in claim 1 wherein the filter unit includes a first tapped delay filter and a second tapped delay filter, wherein the first tapped delay filter is connected to an input of the low pass filter and the second tapped delay filter is connected to an output of the low pass filter, and wherein the second tapped delay filter is matched to the first tapped delay filter, with a square root of $Eq(\alpha,f)$ in each tapped delay filter, to establish the transfer function $RC(\alpha,f)$ for the filter unit.

7. The method as recited in claim 1 wherein the test pattern is a Pseudo-Random Bit Stream (PRBS).

8. A method for assembling a Nyquist filter which comprises the steps of:
creating a filter unit, wherein the filter unit includes a low pass filter and a tapped delay filter, wherein the tapped delay filter has an N number of taps, wherein N is an integer greater than zero, and wherein each tap has a dedicated amplifier;
connecting a Signal Generator to the filter unit for inputting a test pattern into the filter unit to create a reaction signal therefrom, wherein the test pattern is an analog signal having a predetermined symbol rate (Rs), and wherein the test pattern is sampled an n number of times during each symbol cycle, wherein n is a real number greater than one (n>1), and N is greater than n (N>n);
empirically determining a gain for respectively weighting each dedicated amplifier; and
monitoring the reaction signal to establish a transfer function in the filter unit for transforming the reaction signal according to a desired Nyquist response for implementation of the filter unit as the Nyquist filter.

9. The method as recited in claim 8 further comprising the steps of:
selecting a raised cosine filter function, $Hrc(\alpha,f)$, wherein $\alpha$ is a bandwidth factor and f is a frequency, to approximate a desired Nyquist function;
correcting the $Hrc(\alpha,f)$ with a sin c function, $\sin c(\pi f/Rs)$, to establish a sin c corrected raised cosine function, $RC(\alpha,f)$ wherein $\sin c \, \pi f/Rs = \sin(\pi f/Rs)/(\pi f/Rs)$; and
calculating a product of $\sin c(\pi f/Rs)$ with the corrected $RC(\alpha,f)$ for use as a desired reaction signal.

10. A method as recited in claim 9 wherein the filter unit includes a first tapped delay filter and a second tapped delay filter, wherein the first tapped delay filter is connected to an input of the low pass filter and the second tapped delay filter is connected to an output of the low pass filter, and wherein the second tapped delay filter is matched to the first tapped delay filter, with a square root of an equalizer function $Eq(\alpha,f)$ in each tapped delay filter, to establish the transfer function $RC(\alpha,f)$ for the filter unit.

11. The method as recited in claim 9 wherein the desired Nyquist output spectrum created by a Pseudo-Random Bit Stream (PRBS) input signal has a beginning roll-off frequency, $F_{R1}=(1-\alpha)Rs/2$, and an ending roll-off frequency, $F_{R2}=(1+\alpha)Rs/2$, with a bandwidth factor $\alpha=0.25$ functionally corresponding to N=7, and further wherein an equalizer function $Eq(f)$ for the Nyquist filter equals $RC(\alpha,f)/CH(f)$ in the frequency domain, and has an impulse response, eq, in the time domain equal to an Inverse Fast Fourier Transform (IFFT) of the equalizer function $Eq(f)$, $eq=IFFT(Eq(f))$.

12. The method as recited in claim 9 wherein the test pattern is a Pseudo-Random Bit Stream (PRBS).

13. The method as recited in claim 9 further comprising the step of aligning the taps of the tapped delay filter to sample any analog signal having the predetermined symbol rate (Rs) an n number of times during each symbol cycle, wherein n is a real number greater than or equal to one ($n \geq 1$), and N is greater than n (N>n).

14. The method as recited in claim 9 wherein the tapped delay filter is a Finite Impulse Response (FIR) filter.

15. The method as recited in claim 9 wherein the tapped delay filter is a combined Infinite Impulse Response (IIR) filter and a Finite Impulse Response (FIR) filter.

16. A Nyquist filter for filtering an analog input signal having a predetermined symbol rate (Rs) which comprises:
a low pass filter; and
a tapped delay filter, wherein the tapped delay filter has an N number of taps for individually sampling a test pattern in compliance with the predetermined symbol rate, wherein the test pattern is the analog input signal, wherein N is an integer greater than zero, wherein the test pattern is sampled an n number of times during each symbol cycle, wherein n is a real number greater than one (n>1), and N is greater than n (N>n) and wherein each tap has a dedicated amplifier and a respective gain for each dedicated amplifier is empirically weighted based on a comparison of a reaction signal resulting from the test pattern and a desired Nyquist response, to establish a transfer function in the tapped delay filter for filtering the analog input signal with the desired Nyquist response for use as an output from the Nyquist filter.

17. The Nyquist filter as recited in claim 16 wherein the filter unit includes a first tapped delay filter and a second tapped delay filter, wherein the first tapped delay filter is connected to an input to the low pass filter and the second tapped delay filter is connected to an output from the low pass filter, and wherein the second tapped delay filter is matched to the first tapped delay filter, with a square root of an equalizer function $Eq(\alpha,f)$ in each tapped delay filter, wherein $\alpha$ is a bandwidth factor and f is a frequency, to establish the transfer function $RC(\alpha,f)$ for the filter unit.

18. The Nyquist filter as recited in claim 16 wherein the filter unit samples the analog input signal an n number of times during each symbol cycle, wherein n is a real number greater than or equal to one ($n \geq 1$), and N is greater than n (N>n).

19. The Nyquist filter as recited in claim 16 wherein the transfer function is mathematically manipulated to include a sin c correction value.

* * * * *

UNITED STATES PATENT AND TRADEMARK OFFICE
CERTIFICATE OF CORRECTION

PATENT NO. : 9,231,713 B2
APPLICATION NO. : 14/270663
DATED : January 5, 2016
INVENTOR(S) : Chen-Kuo Sun et al.

Page 1 of 1

It is certified that error appears in the above-identified patent and that said Letters Patent is hereby corrected as shown below:

In The Claims

Column 9, Line 8 - DELETE "sin c" and INSERT -- sinc -- in two locations;

Column 9, Line 9 - DELETE "sin c" and INSERT -- sinc --;

Column 9, Line 10 - DELETE "sin c" and INSERT -- sinc --; and

Column 9, Line 13 - DELETE "A" and INSERT -- The --.

Signed and Sealed this
Twelfth Day of July, 2016

Michelle K. Lee
*Director of the United States Patent and Trademark Office*